United States Patent [19]

Merchant

[11] Patent Number: 5,100,572
[45] Date of Patent: Mar. 31, 1992

[54] BINARY AZEOTROPIC COMPOSITIONS OF POLYFLUOROPENTANES AND METHANOL

[75] Inventor: Abid N. Merchant, Wilmington, Del.

[73] Assignee: E. I. Du Pont de Nemours and Company, Wilmington, Del.

[21] Appl. No.: 723,312

[22] Filed: Jun. 28, 1991

Related U.S. Application Data

[63] Continuation-in-part of Ser. No. 592,565, Oct. 3, 1990.

[51] Int. Cl.$^5$ .................. C11D 7/30; C11D 7/50; C09K 5/04; C08J 9/14
[52] U.S. Cl. .................. 252/171; 62/114; 134/12; 134/31; 134/38; 134/39; 134/40; 252/67; 252/162; 252/170; 252/364; 252/DIG. 9; 264/53; 264/DIG. 5; 521/98; 521/131; 570/134
[58] Field of Search .................. 252/67, 69, 162, 170, 252/171, 172, 364, DIG. 9; 134/12, 31, 38, 39, 40; 62/114; 521/98, 131; 264/53, DIG. 5; 570/134

[56] References Cited

U.S. PATENT DOCUMENTS

| | | | |
|---|---|---|---|
| 2,980,740 | 4/1961 | Hasek et al. | 570/134 |
| 3,729,567 | 4/1973 | Terrell | 514/759 |
| 3,927,129 | 12/1975 | Hazeldine et al. | 525/458 |
| 4,169,807 | 10/1979 | Zuber | 252/171 |
| 4,324,930 | 4/1982 | Von Halasz | 570/134 |
| 4,761,970 | 8/1988 | MacCracken | 62/500 |
| 4,947,881 | 8/1990 | Magid et al. | 134/40 |

FOREIGN PATENT DOCUMENTS 431458  6/1991  European Pat. Off.

Primary Examiner—Paul Lieberman
Assistant Examiner—Linda D. Skaling
Attorney, Agent, or Firm—James E. Shipley

[57] ABSTRACT

An azeotropic mixture of polyfluoropentanes and methanol is disclosed. The azeotropic mixture is useful as: a cleaning agent, a blowing agent, a refrigerant, an aerosol propellant, a heat transfer medium and a power cycle working fluid.

8 Claims, No Drawings

BINARY AZEOTROPIC COMPOSITIONS OF POLYFLUOROPENTANES AND METHANOL

CROSS REFERENCE TO RELATED APPLICATION

This application is a continuation-in-part of U.S. Ser. No. 07/592,565 filed Oct. 3, 1990.

BACKGROUND OF THE INVENTION

As modern electronic circuit boards evolve toward increased circuit and component densities, thorough board cleaning after soldering becomes a more important criterion. Current industrial processes for soldering electronic components to circuit boards involve coating the entire circuit side of the board with flux and thereafter passing the flux-coated board over preheaters and through molten solder. The flux cleans the conductive metal parts and promotes solder fusion. Commonly used solder fluxes generally consist of rosin, either used alone or with activating additives, such as amine hydrochlorides or oxalic acid derivatives.

After soldering, which thermally degrades part of the rosin, the flux-residues are often removed from the circuit boards with an organic solvent. The requirements for such solvents are very stringent. Defluxing solvents should have the following characteristics: a low boiling point, be nonflammable, have low toxicity and have high solvency power, so that flux and flux-residues can be removed without damaging the substrate being cleaned.

While boiling point, flammability and solvent power characteristics can often be adjusted by preparing solvent mixtures, these mixtures are often unsatisfactory because they fractionate to an undesirable degree during use. Such solvent mixtures also fractionate during solvent distillation, which makes it virtually impossible to recover a solvent mixture with the original composition.

On the other hand, azeotropic mixtures, with their constant boiling points and constant compositions, have been found to be very useful for these applications. Azeotropic mixtures exhibit either a maximum or minimum boiling point and they do not fractionate on boiling. These characteristics are also important when using solvent compositions to remove solder fluxes and flux-residues from printed circuit boards. Preferential evaporation of the more volatile solvent mixture components would occur, if the mixtures were not azeotropic and would result in mixtures with changed compositions, and with attendant less-desirable solvency properties, such as lower rosin flux solvency and lower inertness toward the electrical components being cleaned. The azeotropic character is also desirable in vapor degreasing operations, where redistilled solvent is generally employed for final rinse cleaning.

In summary, vapor defluxing and degreasing systems act as a still. Unless the solvent composition exhibits a constant boiling point, i.e., is azeotropic, fractionation will occur and undesirable solvent distributions will result, which could detrimentally affect the safety and efficacy of the cleaning operation.

A number of chlorofluorocarbon based azeotropic compositions have been discovered and in some cases used as solvents for solder flux and flux-residue removal from printed circuit boards and also for miscellaneous degreasing applications. For example: U.S. Pat. No. 3,903,009 discloses the ternary azeotrope of 1,1,2-trichlorotrifluoroethane with ethanol and nitromethane; U.S. Pat. No. 2,999,815 discloses the binary azeotrope of 1,1,2-trichlorotrifluoroethane and acetone; U.S. Pat. No. 2,999,817 discloses the binary azeotrope of 1,1,2-trichlorotrifluoroethane and methylene chloride.

Such mixtures are also useful as buffing abrasive detergents, for the removal of buffing abrasive components from polished surfaces, as drying agents for cleaned polished surfaces such as jewelry and metals and as resist-developers in conventional circuit manufacturing techniques, which employ chlorine-type developing agents. The mixtures are also useful as refrigerants, heat transfer media, foam expansion agents, aerosol propellants, solvents and power cycle working fluids. Further, in many cases, the halocarbon component of the azeotropic mixture itself, would be effective in these applications.

Closed-cell polyurethane foams are widely used for insulation purposes in building construction and in the manufacture of energy efficient electrical appliances. Polyisocyanurate board stock is used by the construction industry, in roofing and siding for both its insulative and load-carrying capabilities. Sprayed polyurethane foams are also used in construction for the insulation of large structures such as storage tanks. Pour-in-place polyurethane foams are used as insulative barriers in appliances such as refrigerators and freezers and also in much larger items such as trailer and railroad tanks.

All of the aforementioned types of expandable foam require the use of expansion agents (blowing agents) for their manufacture. Insulative foams require the use of halocarbon blowing agents, owing to their low vapor thermal conductivities, not only to expand the polymer but also to impart the essential insulation feature to the expanded foam. Historically, polyurethane and polyisocyanurate foams have been produced using trichlorofluoromethane (CFC-11), as the blowing agent of choice.

Another important type of insulative foam is the phenolic foam. These foams have heretofore generally been expanded with blends of trichlorofluoromethane (CFC-11) and 1,1,2-trichlorotrifluoroethane (CFC-113) blowing agents.

Still another insulating foam is the thermoplastic or polyolefin type foam. These are generally the polyethylene and polypropylene foams, used widely in packaging. Thermoplastic foams are usually expanded with dichlorodifluoromethane (CFC-12).

Many smaller scale hermetically sealed, refrigeration systems, such as those used in refrigerators or window and auto air conditioners, use dichlorodifluoromethane (CFC-12) as the refrigerant. Larger scale centrifugal refrigeration equipment, such as those used for industrial scale cooling, e.g, commercial office buildings, generally employ trichlorofluoromethane (CFC-11) or 1,1,2-trichlorotrifluoroethane (CFC-113) as the refrigerants of choice. Azeotropic mixtures, with their constant boiling points and compositions have also been found to be very useful as substitute refrigerants, for many of the applications cited above.

Aerosol products have employed both individual halocarbons and halocarbon blends as propellant systems. Halocarbons have also been used both as solvents and propellant vapor pressure attenuators, in aerosol systems. Azeotropic mixtures, with their constant compositions and vapor pressures would be very useful as solvents and propellants in aerosol systems.

Some of the chlorofluorocarbon which are currently used as cleaning agents, blowing agents, refrigerants, aerosol propellants and for other applications, have been linked, theoretically, to depletion of the earth's protective ozone layer. As early as the mid-1970's, it was known that introduction of hydrogen atoms into the chemical structure of previously fully-halogenated chlorofluorocarbons would reduce the chemical stability of these compounds. Hence, the now destabilized compounds would be expected to degrade in the lower atmosphere and not reach the stratospheric ozone layer intact. What is also needed, therefore, are substitute halocarbons, which have low theoretical ozone depletion potentials.

Unfortunately, as recognized in the art, it is not possible to predict the formation of azeotropes. This fact complicates the search for new azeotropic compositions, which have application in the field. Nevertheless, there is a constant effort in the art to discover new azeotropic compositions, which have desirable end-use characteristics.

INVENTION SUMMARY

According to the present invention, binary, azeotropic compositions have been discovered comprising admixtures of effective amounts of polyfluoropentanes and methanol. The azeotrope is an admixture of about 87-97 weight percent polyfluoropentanes and about 3-13 weight percent methanol.

The present invention provides minimum-boiling, azeotropic compositions which are useful as cleaning agents, blowing agents, refrigerants, aerosol propellants, heat transfer media and power cycle working fluids. These blends are potentially environmentally safe substitutes for the halocarbons now used in the applications described above.

DETAILED DESCRIPTION OF THE INVENTION

The composition of the instant invention comprises an admixture of effective amounts of an inseparable mixture of polyfluoropentanes ($C_5H_2or_3F_9or_{10}$, or boiling point=51° C.) and methanol ($CH_3OH$, boiling point=64.7° C.) to form the minimum-boiling, azeotropic compositions.

By azeotropic composition is meant, a constant boiling liquid admixture of two or more substances, whose admixture behaves as a single substance, in that the vapor, produced by partial evaporation or distillation of the liquid has the same composition as the liquid, i.e., the admixture distills without substantial composition change. Constant boiling compositions, which are characterized as azeotropic, exhibit either a maximum or minimum boiling point, as compared with that of the nonazeotropic mixtures of the same substances.

By effective amount is meant the amount of each component of the instant invention admixture, which when combined, results in the formation of the azeotropic composition of the present invention.

It is possible to fingerprint, in effect, a constant boiling admixture, which may appear under many guises, depending upon the conditions chosen, by any of several criteria:

The composition can be defined as an azeotrope of A and B, since the very term "azeotrope" is at once both definitive and limitative, and requires that effective amounts of A and B form this unique composition of matter, which is a constant boiling admixture.

It is well known by those skilled in the art that at different pressures, the composition of a given azeotrope will vary—at least to some degree—and changes in pressure will also change—at least to some degree—the boiling point temperature. Thus an azeotrope of A and B represents a unique type of relationship but with a variable composition which depends on temperature and/or pressure. Therefore compositional ranges, rather than fixed compositions, are often used to define azeotropes.

The composition can be defined as a particular weight percent relationship or mole percent relationship of A and B, while recognizing that such specific values point out only one particular such relationship and that in actuality, a series of such relationships, represented by A and B actually exist for a given azeotrope, varied by the influence of pressure.

Azeotrope A and B can be characterized by defining the composition as an azeotrope characterized by a boiling point at a given pressure, thus giving identifying characteristics without unduly limiting the scope of the invention by a specific numerical composition, which is limited by and is only as accurate as the analytical equipment available.

Binary mixtures of about 87-97 weight percent polyfluoropentanes and about 3-13 weight percent methanol are characterized as azeotropic, in that mixtures within this range exhibit a substantially constant boiling point at constant pressure. Being substantially constant boiling, the mixtures do not tend to fractionate to any great extent upon evaporation. After evaporation, only a small difference exists between the composition of the vapor and the composition of the initial liquid phase. This difference is such that the compositions of the vapor and liquid phases are considered substantially identical. Accordingly, any mixture within this range exhibits properties which are characteristic of a true binary azeotrope. The binary composition, which consists of about 91.9 weight percent polyfluoropentanes and about 8.1 weight percent methanol, has been established, within the accuracy of the fractional distillation method, as a true binary azeotrope, boiling at about 43.4° C., at substantially atmospheric pressure.

The aforestated azeotrope has a low ozone-depletion potential and is expected to decompose almost completely, prior to reaching the stratosphere.

The azeotropic composition of the instant invention permits easy recovery and reuse of the solvent from vapor defluxing and degreasing operations and/or refrigeration operations, because of its azeotropic nature.

The azeotrope of this invention can be used in cleaning processes such as described in U.S. Pat. No. 3,881,949, which is incorporated herein by reference. The azeotropic composition of the instant invention can be prepared by any convenient method including mixing or combining the desired component amounts. A preferred method is to weigh the desired component amounts and thereafter combine them in an appropriate container.

The language "consisting essentially of" is not intended to exclude the presence of minor amounts of materials such as lubricants, antioxidants, etc. which do not significantly alter the azeotropic nature of the composition.

The entire disclosure of all applications, patents and publications, cited above and below, are hereby incorporated by reference.

EXAMPLE 1

A solution which contained 80.0 weight percent polyfluoropentanes [gas chromatographic composition = (80 + 15 + 5) 2,2,3-trihydroperfluoro-n-pentane + 2,3-dihydroperfluoro-n-pentane + 2,3,3-trihydroperfluoro-n-pentane] and 20.0 weight percent methanol was prepared in a suitable container and mixed thoroughly.

The solution was distilled in a 30 plate Oldershaw distillation column, using about a 10:1 reflux to take-off ratio. Head temperatures were read directly to 0.1° C. All temperatures were adjusted to 760 mm Hg pressure. Distillate compositions were determined by gas chromatography. Results obtained are summarized in the Table.

TABLE

DISTILLATION OF:
(80.0 + 20.0)
POLYFLUOROPENTANES (PFPEN)
AND METHANOL (MEOH)

| CUTS | DISTILLED WT % | HEAD TEMP. °C. | PERCENTAGE RECOVERED PFPEN | MEOH |
|---|---|---|---|---|
| PRE | 6.6 | 42.7 | 92.68 | 7.32 |
| 1 | 13.9 | 42.8 | 92.19 | 7.81 |
| 2 | 21.2 | 42.9 | 91.60 | 8.40 |
| 3 | 29.2 | 43.3 | 91.86 | 8.14 |
| 4 | 37.7 | 43.3 | 91.77 | 8.23 |
| 5 | 46.0 | 43.5 | 91.90 | 8.10 |
| 6 | 51.6 | 43.9 | 92.02 | 7.98 |
| 7 | 57.1 | 44.7 | 92.09 | 7.91 |
| HEEL | 40.4 |  | 68.73 | 31.27 |

Analysis of the above data indicates very small differences exist between head temperatures and distillate compositions, as the distillation progressed. A statistical analysis of the data demonstrates that the true binary azeotrope of polyfluoropentanes and methanol has the following characteristics at atmospheric pressure (99 percent confidence limits):

Polyfluoropentanes = 91.9 ± 0.2 wt. %
Methanol = 8.1 ± 0.2 wt. %
Boiling point = 43.4 ± 0.4° C.

EXAMPLE 2

Several single sided circuit boards were coated with activated rosin flux and soldered by passing the boards over a preheater, to obtain top side board temperatures of approximately 200° F. (93° C.), and then through 500° F. (260° C.) molten solder. The soldered boards were defluxed separately, with the azeotropic mixture cited in Example 1 above, by suspending a circuit board, first, for three minutes in the boiling sump, which contained the azeotropic mixture, then, for one minute in the rinse sump, which contained the same azeotropic mixture, and finally, for one minute in the solvent vapor above the boiling sump. The boards cleaned in the azeotropic mixture had no visible residue remaining thereon.

EXAMPLE 3

A mixture of 145 g (0.58 mol) of perfluoropentene-2, 4.0 g of 5% Pd on carbon, and 150 ml of absolute ethanol was shaken in a Parr apparatus at 25° C. under 50 psi of hydrogen pressure until hydrogen uptake ceased (8 hr). A crude distillation gave 130.1 g of liquid, bp 26°–77° C. This distillate was combined with a similar crude product from reduction of 77 g (0.31 mol) of perfluoropentene-2, washed with 100 ml of water, dried, and distilled to obtain 128 g of polyfluoropentanes, bp 49°–51° C. NMR analysis indicated the composition to be about 85% isomeric trihydrononafluoropeptanes and 15% dihydrodecafluoropentanes, as used in Example 1 above.

From the foregoing description, one skilled in the art can easily ascertain the essential characteristics of this invention, and without departing from the spirit and scope thereof, can change and modify the invention to adapt it to various usages and conditions.

We claim:

1. An azeotropic composition consisting essentially of about 87–97 weight percent polyfluoropentanes consisting essentially of about 80 weight percent 2,2,3-trihydroperfluoro-n-pentane, about 15 weight percent 2,3-dihydroperfluoro-n-pentane and about 5 weight percent 2,3,3-trihydroperfluoro-n-pentane, and about 3–13 weight percent methanol wherein the composition has a boiling point of about 43.4° C. when the pressure is adjusted to substantially atmospheric pressure.

2. An azeotropic composition of claim 1, consisting essentially of about 91.9 weight percent polyfluoropentanes and about 8.1 weight percent methanol.

3. The process for cleaning a solid surface which comprises treating said surface with an azeotropic composition of claim 1.

4. The process of claim 3, wherein the solid surface is a printed circuit board contaminated with flux and flux-residues.

5. The process of claim 3, wherein the solid surface is a metal, a glass or a plastic.

6. In a process for expanding polymeric foams with a blowing agent, the improvement wherein the blowing agent is an azeotropic composition of claim 1.

7. A process for producing refrigeration which comprises evaporating an azeotropic composition of claim 1 in the vicinity of a body to be cooled.

8. A process for producing heat which comprises condensing the azeotropic composition of claim 1 in the vicinity of a body to be heated.

* * * * *